United States Patent [19]
Levinson et al.

[11] Patent Number: 5,969,807
[45] Date of Patent: Oct. 19, 1999

[54] METHOD FOR MEASURING LENS IMAGING UNIFORMITY

[75] Inventors: Harry J. Levinson, Saratoga; Khanh Nguyen, San Mateo, both of Calif.

[73] Assignee: Advanced Micro Devices, Inc., Sunnyvale, Calif.

[21] Appl. No.: 09/047,920

[22] Filed: Mar. 25, 1998

[51] Int. Cl.$^6$ .................................................. G01B 11/00
[52] U.S. Cl. .......................... 356/124; 356/399; 356/401; 355/55
[58] Field of Search .................................... 356/399–401, 356/124; 250/548, 559.3; 355/43, 53, 67; 430/22

[56] References Cited

U.S. PATENT DOCUMENTS 5,850,279   12/1998   Nara et al. ............................... 356/399

OTHER PUBLICATIONS

"Pattern transfer at $k_1$=0.5: Get 0.25 μm lithography ready for manufacturing", Wilhelm Maurer, Kjmihiro Satoh, Don Samuels and Thomas Fischer, SPIE, vol. 2726, pp. 113–124.
*Silicon Processing for the VLSI Era, vol. 1—Process Technology*, "Lithography I: Optical Photoresist Material and Process Technology" Chapter 12, S. Wolf and R. N. Tauber, pp. 407–409.
*Silicon Processing for the VLSI Era, vol. 1—Process Technology*, "Lithography II: Optical Aligners and Photomasks" Chapter 13, S. Wolf and R. N. Tauber, pp. 459–489.

*Primary Examiner*—Hoa Q. Pham
*Attorney, Agent, or Firm*—Renner, Otto, Boisselle & Sklar, P.L.L.

[57] ABSTRACT

A method (100) of separating linewidth variations due to reticle generation defects from other linewidth variations at a substrate surface during a pattern transfer process includes generating (102) a test reticle (200) having a first plurality of structures (204) forming a first pattern (202). The method further includes measuring a dimension (104) of two or more of the first plurality of structures (204) on the test reticle (200), thereby creating (106) a first data set representing linewidth variations due to the test reticle generation. A second pattern is transferred (108) to the surface of the substrate, wherein the second pattern includes a second plurality of structures which substantially correspond to the first plurality of structures and a dimension of two or more of the second plurality of structures (110) are measured, thereby creating (112) a second data set representing the linewidth variations at the surface of the substrate. The first and second data sets are then evaluated (114), thereby identifying an amount of contribution to the substrate linewidth variations due to the test reticle generation. A test reticle (200) for measuring the lens imaging uniformity across a lens image field of a pattern transfer apparatus is also disclosed and includes a plurality of test structures (204). At least one of the test structures has a different design linewidth different than the others of the plurality of test structures, and when the plurality of test structures are measured, linewidth measurements are collected for more than one design linewidth, thereby generating a first data set. When patterns corresponding to the plurality of test structures are transferred to a substrate via the pattern transfer apparatus, a plurality of substrate structures are formed on the substrate and when the plurality of substrate structures are measured, linewidth measurements are collected for more than one patterned linewidth, thereby generating a second data set. The first and second data sets are then utilized to interpolate components of linewidth variations at a nominal linewidth.

35 Claims, 8 Drawing Sheets

METHOD FOR MEASURING LENS IMAGING UNIFORMITY

FIELD OF THE INVENTION

The present invention generally relates to optical aligner lithography tools and methods for using such tools, and more particularly relates to a method for measuring lens imaging uniformity in a reduction step-and-repeat or step-and-scan projection alignment system such as a reduction stepper.

BACKGROUND OF THE INVENTION

Lithography in semiconductor processing relates generally to the process of transferring patterns which correspond to desired circuit components onto one or more thin films which overlie a substrate. One important step within the field of lithography involves optical tools and methods for transferring the patterns to the films which overlie the semiconductor wafer. Patterns are transferred to a film by imaging various circuit patterns onto a photoresist layer which overlies the film on the wafer. This imaging process is often referred to as "exposing" the photoresist layer. The benefit of the exposure process and subsequent processing allows for the generation of the desired patterns onto the film on the semiconductor wafer, as illustrated in prior art FIG. 1a–1f.

Prior art FIG. 1a illustrates a photoresist layer 10 deposited by, for example, spin-coating, on a thin film 11 such as, for example, silicon dioxide ($SiO_2$) which overlies a substrate 12 such as silicon. The photoresist layer 10 is then selectively exposed to radiation 13 (e.g., ultraviolet (UV) light) via a photomask 14 (hereinafter referred to as a "mask") to generate one or more exposed regions 16 in the photoresist layer 10, as illustrated in prior art FIG. 1b. Depending on the type of photoresist material utilized for the photoresist layer 10, the exposed regions 16 become soluble or insoluble in a specific solvent which is subsequently applied across the wafer (this solvent is often referred to as a developer).

The exposed regions 16 are made either soluble or insoluble in the developer. When the exposed regions 16 are made soluble, a positive image of the mask 14 is produced in the photoresist layer 10, as illustrated in prior art FIG. 1c, and the photoresist material is therefore referred to as a "positive photoresist". The exposed underlying areas 18 in the film 11 may then be subjected to further processing (e.g., etching) to thereby transfer the desired pattern from the mask 14 to the film 11, as illustrated in prior art FIG. 1d (wherein the photoresist layer 10 has been removed). Conversely, when the exposed regions 16 are mode insoluble, a negative image of the mask 14 is produced in the photoresist 10 layer, as illustrated in prior art FIG. 1e, and the photoresist material is therefore referred to as a "negative photoresist". In a similar manner, the exposed underlying areas 20 in the film 11 may then be subjected to further processing (e.g., etching) to thereby transfer the desired pattern from the mask 14 to the film 11, as illustrated in prior art FIG. 1f.

The transfer of patterns to the photoresist layer 10 as discussed above involves the use of optical aligners. Optical aligners are machines which contain a variety of subsystems that work together to form the imaging function. Such optical aligners include: (1) an illumination source which provides the optical energy (UV light in the above example) for transforming the photoresist via exposure, (2) an optical subsystem that focuses the circuit patterns onto the photoresist surface and allows for controlled exposure times, and (3) and a movable stage that holds the wafer being exposed.

Historically, three primary methods have been used to optically transfer a mask pattern to a photoresist covered film. These methods are: contact printing, proximity printing and projection printing and are illustrated in simplified form in prior art FIGS. 2a–2d, respectively. Contact printing 100, as illustrated in prior art FIG. 2a, was the earliest method used to produce patterns. Contact printing 100 involves a light source 112, an optical system 114, a mask 116 and a photoresist layer 118 overlying a thin film 119 (not shown) which, in turn, overlies a semiconductor wafer 120. The mask 116, which contains the desired circuit patterns for transfer to the photoresist layer 118, is positioned (aligned) relative to any existing patterns that already existed on the wafer 120. The mask 116 is then clamped down to the photoresist layer 118, thereby making physical contact with the photoresist layer 118, and exposed with ultraviolet (UV) light from the light source 112. This method provides for an excellent image transfer and good resolution (i.e., good minimum linewidth spacing).

Contact printing, however, suffers from the direct contact made between the mask 116 and the photoresist layer 118. The repeated contact made between the mask 116 and the photoresist layer 118 in the process results in defects generated in the mask 116 which are then reflected in the transfer made on subsequently processed wafers. To prevent this problem, the masks 116 must be disadvantageously inspected and cleaned regularly. In addition, small particles may be caught between the mask 116 and the photoresist layer 118 when affixing the two elements, thereby preventing the desired direct contact between the mask 116 and the photoresist layer 118. This particulate contamination results in reduced resolution in the area local to the foreign particle. Consequently, contact printing is not common in VLSI semiconductor manufacturing.

Proximity printing 122, as illustrated in prior art FIG. 2b, involves placing the mask 116 near the wafer 120 (which is covered with the photoresist 118) during exposure, however, the mask 116 and the wafer 120 do not make contact. By introducing a gap 124 between the mask 116 and the wafer 120, the defect problem of contact printing is substantially avoided. Unfortunately, as the gap 124 increases, the resolution of the proximity printing system 122 rapidly deteriorates. For example, a 10 $\mu$m gap with a 400 nm exposure (the wavelength of the light source 112) results in a minimum resolution of about 3 $\mu$m. In addition, proximity printing 122 requires extremely flat masks 116 and wafers 120 in order to prevent gap variations spatially about the wafer 120. Since many VLSI semiconductor circuits today require features of 0.25 $\mu$m or less, proximity printing 122 is not considered adequate for many VLSI semiconductor manufacturing operations.

Projection printing is a generic term that encompasses various pattern transfer techniques. These techniques, for example, include: (a) projection scanning systems, (b) reduction (e.g., 4X or 10X) step-and-repeat projection systems and (c) reduction step-and-scan systems. In each system, lens elements or mirrors are used to focus the mask image on the wafer surface (containing the photoresist).

Projection scanning systems (often called scanning projection aligners), use a reflective spherical mirror (reflective optics) to project an image onto the wafer surface, as illustrated, for example, in prior art FIG. 2c. The system 126 includes a primary mirror 128 and a secondary mirror 129 which are arranged with the mask 116 and the wafer 120 to image the mask pattern onto the photoresist layer 118 which overlies the film 119 on the wafer 120 (the photoresist layer 118 and the thin film 119 are not shown in FIG. 2c for simplicity). A narrow arc of radiation is imaged from the mask 116 to the wafer 120 with light that travels an optical path that reflects the light multiple times. The mask 116 and the wafer 120 are scanned through the arc of radiation by means of a continuous scanning mechanism (not shown). The scanning technique minimizes mirror distortions and aberrations by keeping the imaging illumination in the "sweet spot" of the imaging system 128 and 129.

Reduction step-and-repeat systems 130 (also called reduction steppers) use refractive optics (as opposed to reflective optics in the system 126 of prior art FIG. 2c) to project the mask image onto the photoresist layer 118 which overlies the firm 119 on the wafer 120, as illustrated, for example, in prior art FIG. 2d. The reduction stepper 130 includes a mirror 132, a light source 134, a filter 136, a condenser lens system 138, a reticle 140, a reduction lens system 142 and the wafer 120. The mirror 132 behaves as a collecting optics system to direct as much of the light from the light source 134 (e.g., a mercury-vapor lamp) to the wafer 120. The filter 136 is used to limit the light exposure wavelengths to the specified frequencies and bandwidth. The condenser system 138 focuses the radiation through the reticle 140 and to the reduction lens system to thereby focus a "masked" radiation exposure onto a limited portion of the wafer 120, namely onto a single semiconductor die 144.

Since it is complex and expensive to produce a lens capable of projecting a mask pattern of an entire 150 mm or 200 mm wafer, the refractive system 130, as illustrated in prior art FIG. 2d, projects an image only onto a portion of the wafer 120 corresponding to an individual semiconductor die 144. This image is then stepped and repeated across the wafer 120 in order to transfer the pattern to the entire wafer (and thus the name "steppers"). Consequently, the size of the wafer is no longer a consideration for the system optics.

The reduction stepper system 130 thus uses the reticle 140 instead of a mask. Reticles are similar to masks, but differ in that a mask contains a pattern for transfer to the entire wafer in one exposure while a reticle contains a pattern image for a single or several semiconductor die that must be stepped and repeated across the wafer 120 in order to expose the entire wafer substrate. Current reduction stepper systems such as the system 130 utilize reticles that contain a pattern that is an enlargement of the desired image on the wafer 120. Consequently, the reticle pattern is reduced when projected onto the wafer 120 during exposure (and thus the name "reduction stepper").

One advantage of stepper technology over the full wafer scanning type technology is higher image resolution (i.e., smaller minimum linewidths). In addition, stepping each die on the wafer 20 allows compensation for wafer distortion. Further still, reduction steppers provide good overlay accuracy. Steppers do, however, exhibit reduced throughput (number of wafers/hour) and require precision control of the mechanical stage (not shown) which holds the wafer 120. The advantages of reduction steppers, however, presently outweigh their disadvantages and thereby make reduction steppers quite popular in the manufacture of VLSI semiconductors with minimum linewidths less than 1 $\mu$m.

SUMMARY OF THE INVENTION

The present invention relates to a method for measuring lens imaging uniformity across an image field of an optical alignment and pattern transfer system such as a reduction stepper. Linewidth variations on a wafer surface due to lens imaging non-uniformities are distilled from the total linewidth variations measured at the wafer surface using a test reticle to thereby separate the two primary components of linewidth variations (i.e., lens imaging nonuniformity and reticle manufacturing defects) for individual analysis and monitoring.

Once the lens imaging uniformity is characterized across the image field, standard production reticles may be used according to conventional manufacturing techniques. For test purposes, when the actual total linewidth variations are measured at the wafer surface, the linewidth variations due to dimensional variation on the reticle at any point on the wafer surface can be determined since the lens imaging uniformity at that point of the image field is known. Therefore the present invention provides a simple way to monitor the various components of linewidth variations in optical transfer systems.

According to one aspect of the present invention, a test reticle is generated having a plurality of structures which have intentional differences in linewidths. The actual dimensions of the structures on the reticle are then measured and recorded, thereby determining the actual reticle linewidth variations due to reticle manufacturing variations. The reticle pattern is then transferred to a wafer according to conventional lithography techniques and the patterns are then measured at the wafer surface and recorded. A graph is then generated wherein the actual measured reticle linewidth and the actual measured wafer linewidth is plotted for each of the plurality of structures.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
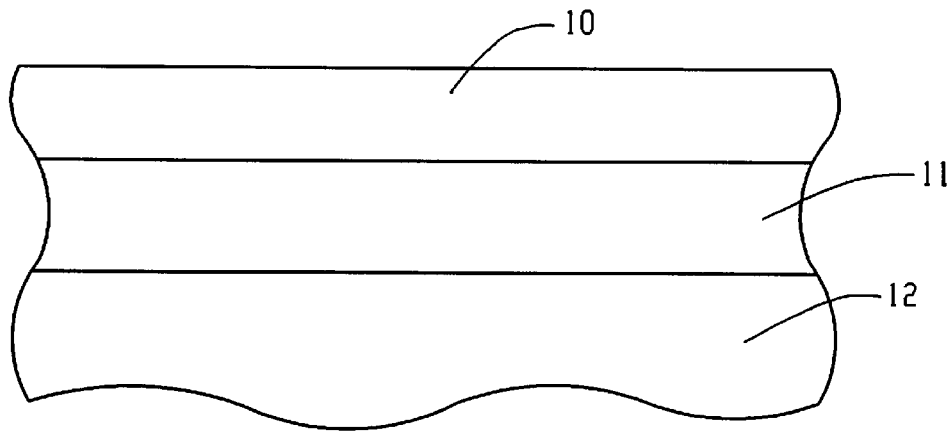
FIG. 1a is a fragmentary cross section illustrating a prior art semiconductor substrate having a film overlying the substrate which in turn is covered by a photoresist layer.
Figure 1B:
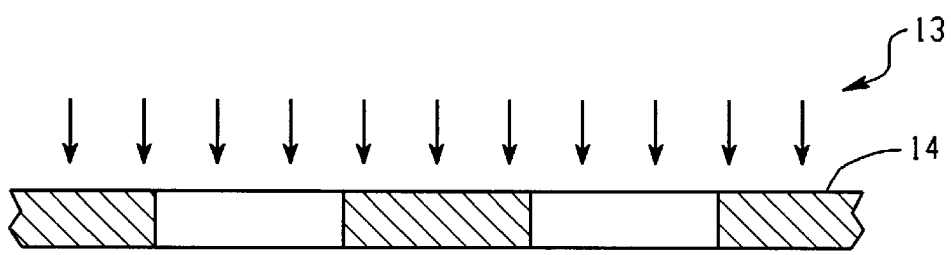
FIG. 1b is a fragmentary cross section illustrating a prior art method of selectively exposing a photoresist layer using a mask.
Figure 1B:
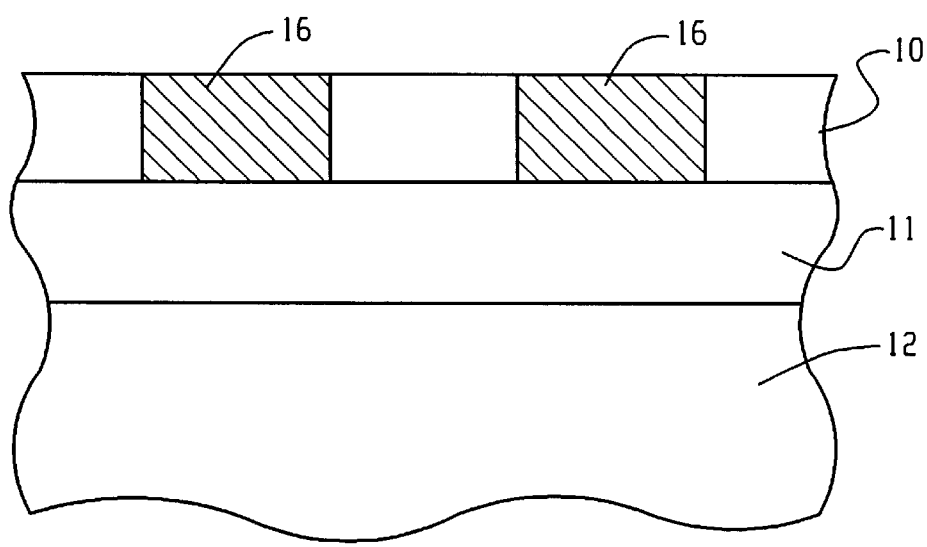
Figure 1C:
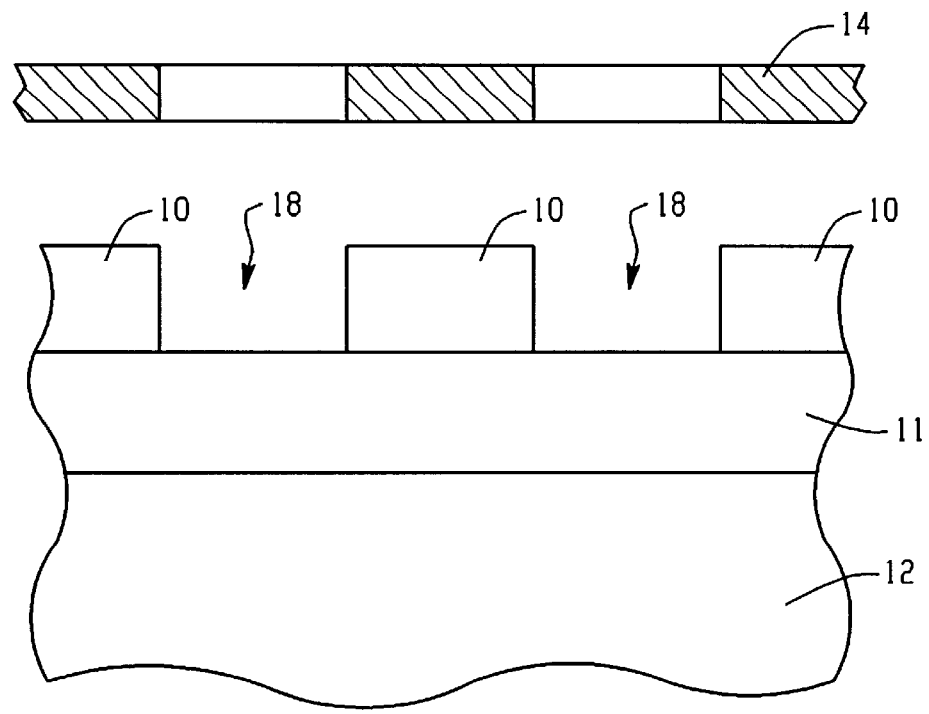
FIG. 1c is a fragmentary cross section illustrating a positive photoresist layer after being developed.
Figure 1D:
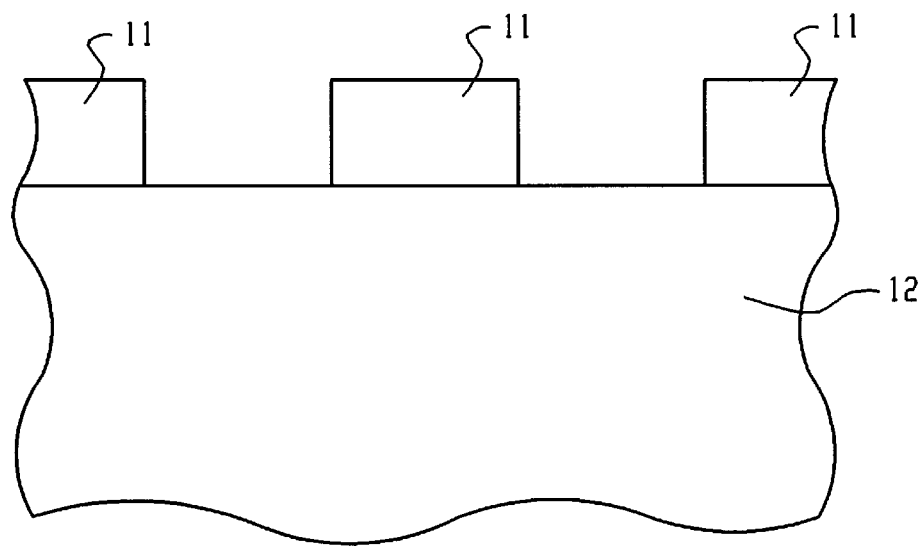
FIG. 1d is a fragmentary cross section illustrating a transfer of a mask pattern to the film.
Figure 1E:
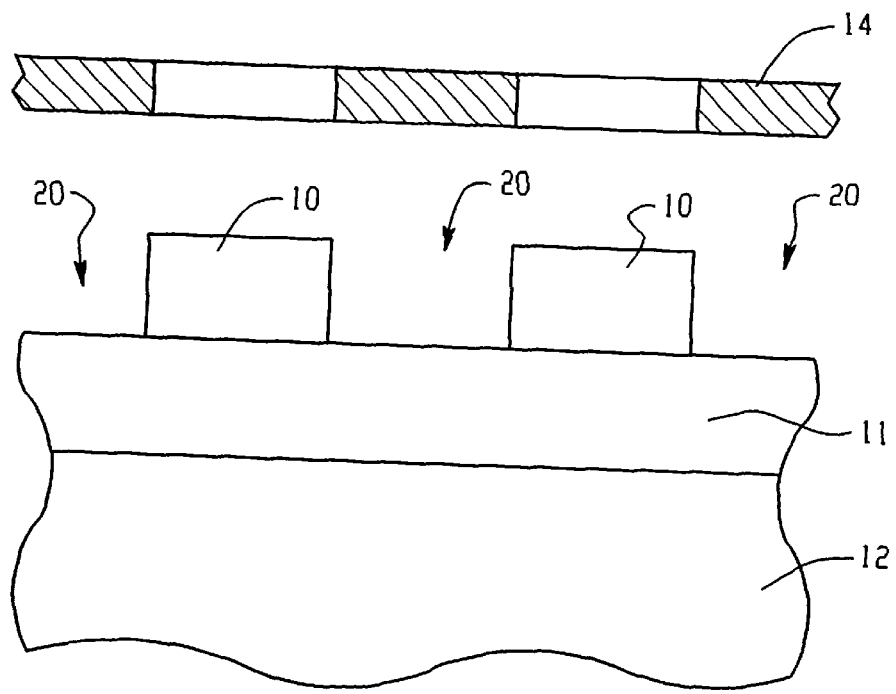
FIG. 1e is a fragmentary cross section illustrating a negative photoresist layer after being developed.
Figure 1F:
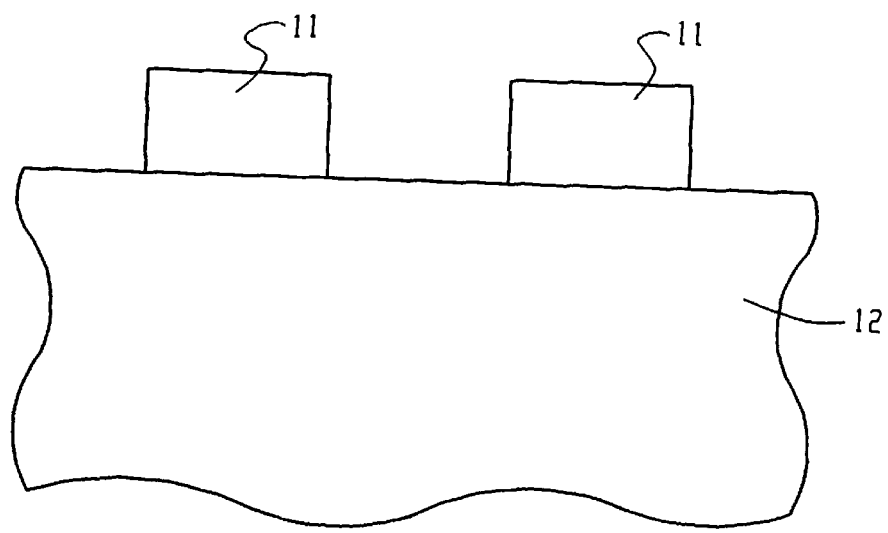
FIG. 1f is a fragmentary cross section illustrating a transfer of a mask pattern to the film.

The following is a detailed description of the present invention made in conjunction with the attached Figures, wherein like reference numerals will refer to like elements throughout. The present invention includes a method of measuring lens imaging uniformity by determining the linewidth variation contribution of the reticle, thereby isolating the reticle component of linewidth error from the total linewidth variations. Consequently, each primary component of linewidth variation which contributes to the total linewidth error (i.e., reticle error and optics error) can be evaluated separately for purposes of equipment performance evaluation and development and manufacturability.

The reticle component of linewidth variations is isolated from the total linewidth variations through use of a test reticle. The test reticle is generated, for example, with a plurality of structures forming a grid-type pattern wherein each of the structures intentionally differs from one another in linewidth. According to a preferred embodiment of the present invention, each of the structures varies in linewidth from another by a predetermined amount such as, for example, 2%–5% of a nominal linewidth. After generation of the test reticle, the actual reticle dimensions are not exactly the design dimensions due to the above-mentioned defects in the reticle manufacturing process. The actual dimensions of the reticle are measured and recorded. The reticle pattern is then transferred to the wafer via the reduction stepper optics using conventional lithographic techniques. The fabricated linewidths on the wafer are then measured and recorded. A graph is then plotted, preferably for each point in the image field, representing the actual reticle linewidth dimension and the actual wafer linewidth, thereby providing a graphical representation of the linewidth variations due to reticle error as a component of the entire linewidth variations across the wafer. Consequently, the linewidth variation due to the lens imaging is also determined. A detailed description of the invention and an explanation of its utility follows below.

Figure 2A:
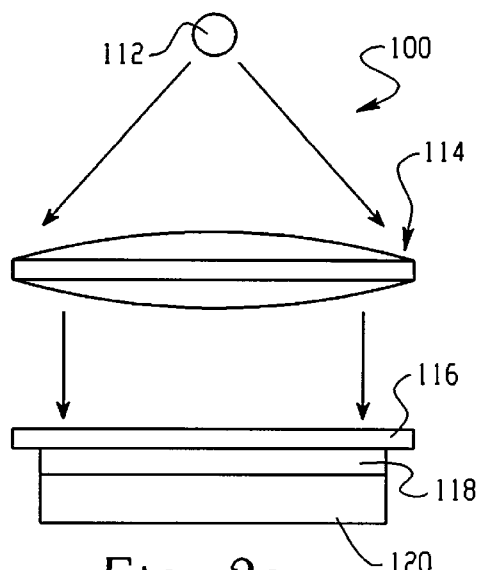
FIG. 2a is a system view of a prior art contact printing system wherein a mask physically contacts the wafer during transfer of a pattern to the wafer.
Figure 2B:
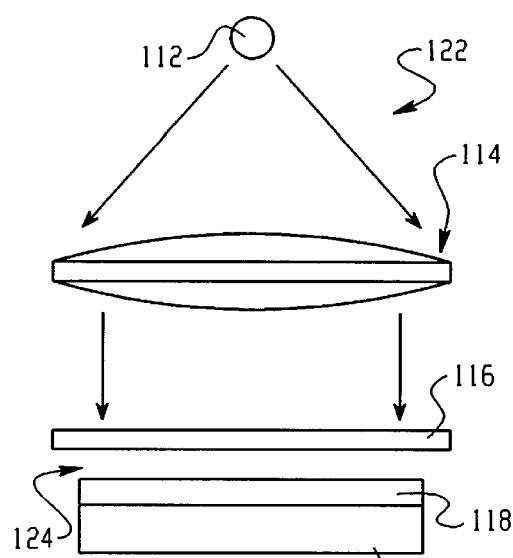
FIG. 2b is a system view of a prior art proximity printing system wherein a mask is separated from the underlying wafer by a gap during transfer of a pattern to the wafer.
Figure 2C:
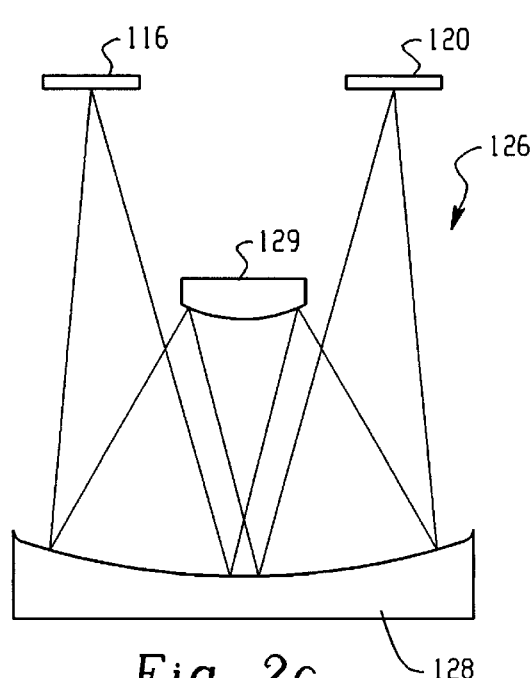
FIG. 2c is a system view of a prior art scanning projection system wherein reflective optics are used to transfer a pattern to the wafer.
Figure 2D:
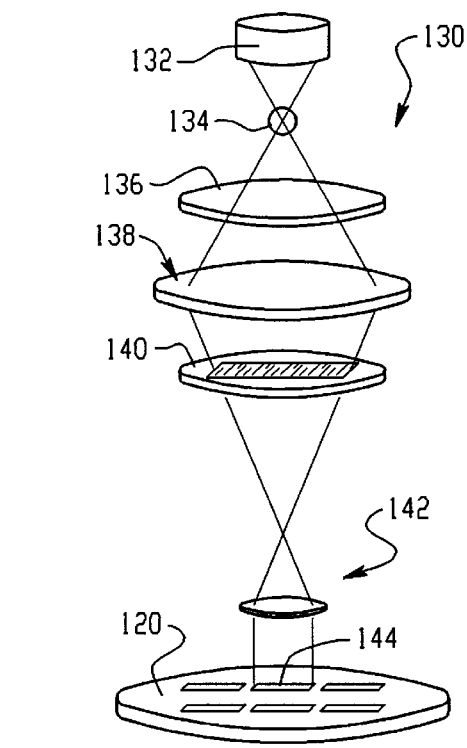
FIG. 2d is a system view of a prior art reduction stepper wherein refractive optics are used to transfer a pattern to a localized region on the wafer.

Although reduction steppers such as the system 130 of prior art FIG. 2d provide significant performance improvements in linewidth resolution over other optical pattern transfer systems, linewidth variations still exist across the image field of the reduction stepper 130. It is always desirable to improve performance in order to further decrease linewidths and thereby increase the number of circuit devices that can fit onto a single wafer. It has been found that the linewidth variations have two primary components. One source of linewidth variation is due to the non-perfect optics of the reduction lens system 142. A second source of linewidth variation is due to linewidth variations on the manufactured reticle 140 created during the reticle manufacturing process. Because both of these factors contribute to undesired linewidth variations and the causes (and corresponding solutions) for each linewidth variation component are diverse, it is desirable to identify which portion of the total linewidth variation measured on the wafer surface is due to the system optics and which portion is due to reticle defects. Therefore one can focus on each problem separately and monitor improvements in each area (optics and reticle manufacturing) individually.

Prior to the present invention, measuring linewidth variations across the image field of the stepper (i.e., the linewidth variations due to the optics) have been difficult because the reticle linewidth variations represent a substantial fraction of the total linewidth variations which are measurable on the wafer. For example, variations for 250 nm linewidths (0.25 $\mu$m) are typically on the order of 20 nm across a lens field, which represents the total linewidth variations. Linewidth variations on reticles (which are created during the manufacture of the reticle) are specified in the range of about 50 nm. Present leading-edge steppers have 4:1 lens reductions, so the 50 nm variation on the reticles represents a 12.5 nm linewidth variation at the wafer surface, which represents over half (12.5/20) of the total contributions. Moreover, the reticle linewidth variations are transferred non-linearly to the wafer for optics operated near the diffraction limit as is well known by those skilled in the art, and which occurs routinely in lithography for VLSI manufacturing. Consequently, it has heretofore been difficult to establish the lens imaging uniformity of the stepper optics due to the substantial non-linear reticle linewidth variations which contribute to the total linewidth variations at the wafer surface.

In light of the above, the present invention is directed toward a method for measuring lens imaging uniformity by distilling the linewidth variations due to the reticle from the linewidth variations due to the reduction stepper optics. Consequently, process developers can monitor each source of linewidth error separately and thereby identify which component is being improved or needs further improvement as further process and equipment improvements are made.

Figure 3:
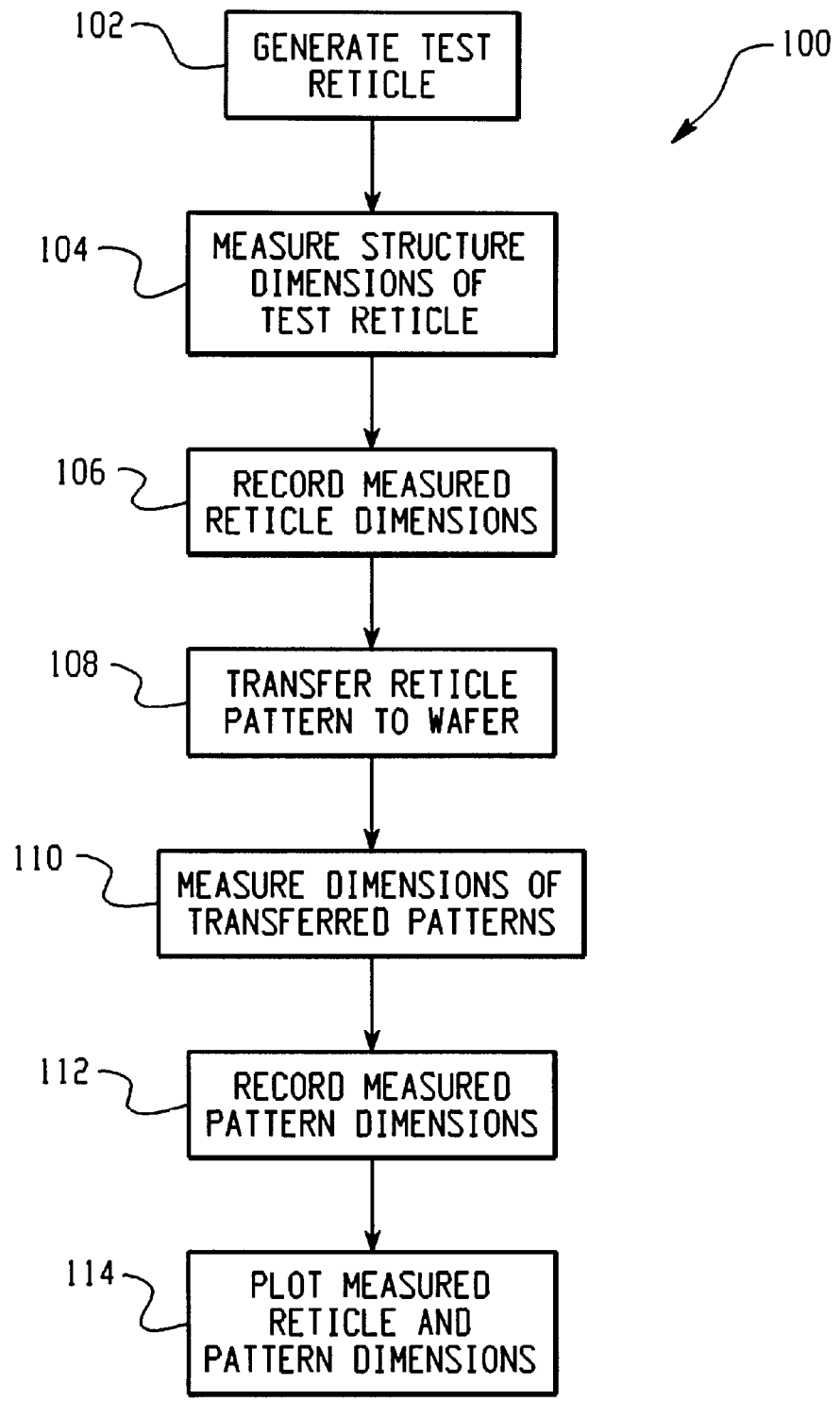
FIG. 3 is a flow chart illustrating a method of measuring lens imaging uniformity across an image field according to the present invention.

One exemplary embodiment of the present invention is illustrated in FIG. 3, which is a flow chart illustrating a method 100 for measuring lens imaging uniformity. The method 100 includes the generation of a test reticle having a plurality of test structures at step 102, the details of which will be described infra. The test reticle is then inspected to measure the actual reticle dimensions at step 104. The reticle dimensions may be measured using, for example, optical, confocal and scanning electron microscopes, all of which are generally known techniques for measuring the dimensions of an object in semiconductor processing. Consequently, the actual linewidth variations from the reticle design specifications are determined; and the measured reticle dimensions are recorded, preferably on a computer storage medium, at step 106.

After the test reticle has been generated and inspected, the method 100 continues at step 108, where the pattern (the plurality of reticle test structures) is transferred to a wafer according to conventional reduction stepper optical transfer techniques. After transfer of the pattern is complete, the actual wafer patterns are inspected and measured at step 110 and likewise recorded at step 112. The actual wafer pattern dimensions are measured using, for example, a scanning electron microscope, an electrical probe method or an atomic force microscope, all of which are generally known techniques for measuring features on the wafer. The stored data, which comprises the actual reticle linewidth dimension data (step 106) and the actual wafer linewidth dimension data (112) is plotted at step 114 and a curve is found to fit the data, thereby providing a graphical representation of the contribution of the actual reticle variations on the total variations. Since the remaining portion of the linewidth variations is substantially attributable to the imaging system of the pattern transfer apparatus, the lens imaging uniformity can be analyzed at that point of the lens image field. Since a plurality of test structures may be formed across the reticle at various portions, lens imaging uniformity data may be collected substantially at each point of the lens image field.

Note that in the method 100 of FIG. 3, the manufacture and measurement of the test reticle are performed using conventional manufacture and inspection techniques. Additionally, the transfer of the reticle pattern to the wafer and the subsequent measurement of the actual linewidth variations at the wafer surface are also performed using convention pattern transfer and inspection techniques. Therefore the method 100 does not require any special equipment or processing steps.

Figure 4A:
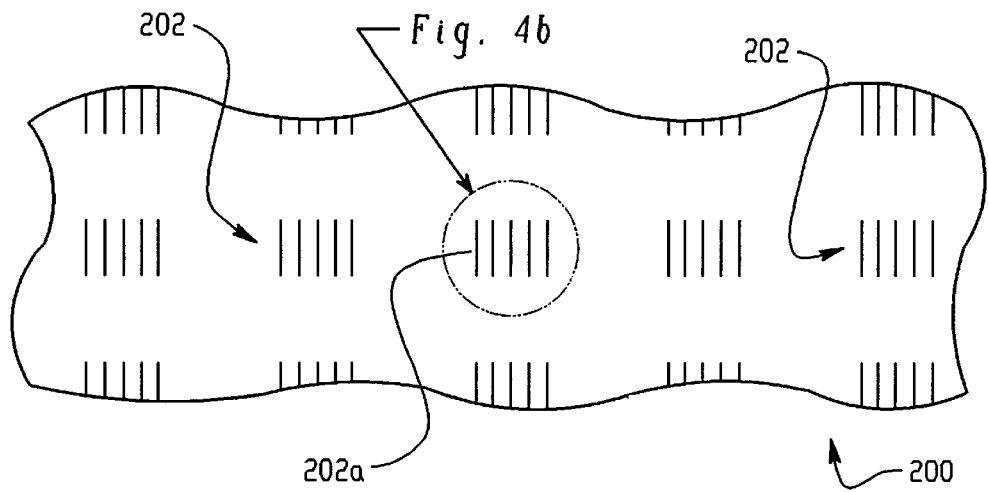
FIG. 4a is a fragmentary plan view of a test reticle according to one aspect of the present invention.
Figure 4B:
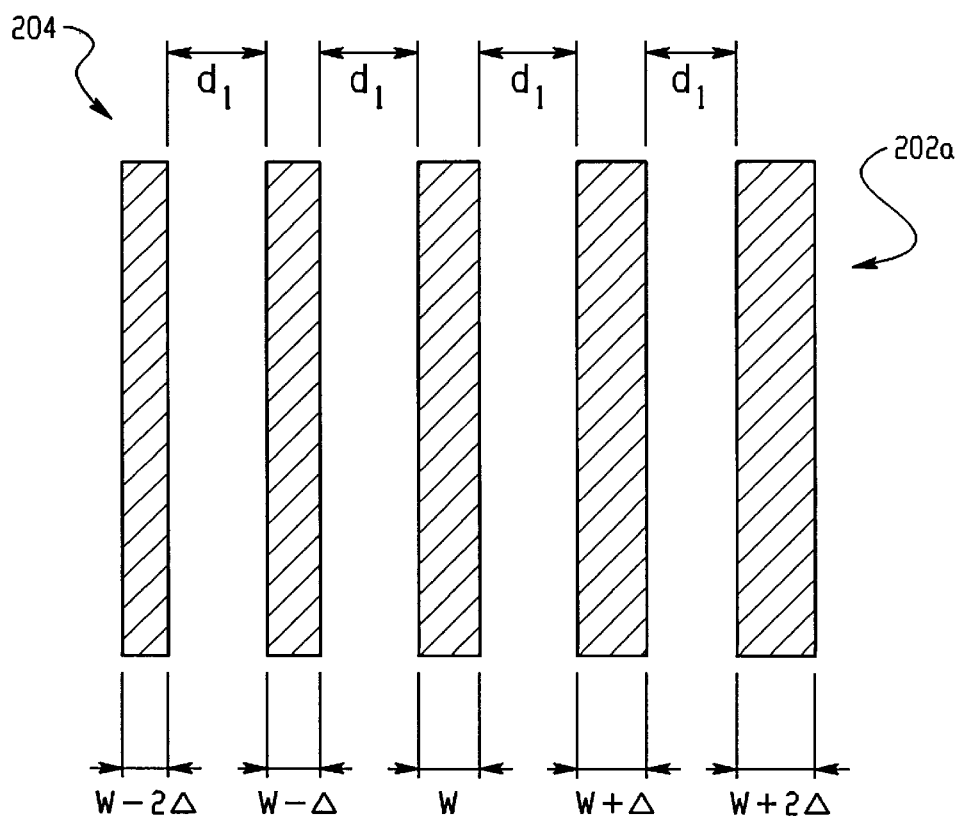
FIG. 4b is an exploded plan view of a portion of FIG. 4a illustrating in greater detail the test reticle pattern according to the present invention.

The step of generating the test reticle 102 is described in greater detail with respect to FIGS. 4a and 4b. FIG. 4a illustrates a fragmentary plan view of a test reticle 200 according to the present invention. The test reticle 200, according to a preferred embodiment, includes a plurality of test structure groups 202, wherein each of the groups 202 include a plurality of test structures which form a grid-like pattern. The groups 202 are preferably located across the entire surface of the test reticle 200 so as to substantially correspond with each point of the reduction stepper lens image field. The lens image field is divided nominally into a two-dimensional array, and data resembling that of FIG. 5 (as will be described infra) is stored in memory for each location in the array. Therefore, data may be collected for substantially each point in the lens image field. Consequently, the present invention may be customized to correspond only to particular portions of the lens image field or to the entire lens image field, as may be desired.

An exploded view of a particular group 202a of FIG. 4a is illustrated in FIG. 4b, wherein the grid-like pattern is illustrated in greater detail. The group 202a includes a plurality of structures 204 which intentionally vary in linewidth from one another. In the exemplary embodiment of FIG. 4b, a nominal linewidth (w) of the structure 204a is a 250 nm feature (0.25 $\mu$m) while each of the other features intentionally vary a distance $\pm n\Delta$ (wherein n=1 or 2 in the present example) which is preferably about 2%–5% of the nominal linewidth. Therefore in the exemplary embodiment of the present invention illustrated in FIG. 4b, the features may be 230, 240, 250, 260 and 270 nm, respectively (corresponding to w-2$\Delta$, w-$\Delta$, w+$\Delta$ and w+2$\Delta$, wherein $\Delta$=10 nm). The structures 204 are preferably placed in close proximity to one another so that the data collected according to the present invention represents approximately the same portion of the lens image field. Alternatively, the linewidth variation may be further increased, but is not preferred because further variations make subsequent curve-fitting more difficult due to a high degree of nonlinearity.

Although it is desirable for the structures of FIG. 4b to be close together in order for the data to represent approximately the same portion of the lens image field, it is also preferred that the structures be sufficiently spaced apart so that each of the structures 204 may be considered an isolated structure (often called an isolated feature). As is well known by those skilled in the art of lithography, the optical transfer of a pattern is a function of the reticle pattern feature itself on reticle as well as other surrounding features on the reticle. When features are substantially close together, the effect of neighboring features to the optical transfer of the desired feature is not negligible and the features are called "non-isolated features." If, however, neighboring features are spaced sufficiently far apart, the effect of neighboring features (although not absolutely zero) is negligible for purposes of the present invention and the features are considered "isolated features." In the preferred embodiment of the present invention, the separation distance "$d_1$" of each structure 204 of FIG. 4b is about six times (6X) the nominal feature size (i.e., 1.5 $\mu$m→6×0.25 $\mu$m). Although 6X is the preferred distance since it sufficiently isolates each of the structures, yet meets the desired criteria that the entire group 202a approximately represent a single point in the lens field, it should be understood that tighter spacing is contemplated as falling within the scope of the present invention (such as, for example, 3X or 4X). Furthermore, it is appreciated that even tighter spacing may be used if small, non-isolated feature variations are permitted for a particular application, as may be desired.

After creation of the test reticle at step 102 according to the preferred design specifications highlighted above, the actual reticle structure dimensions are measured according to conventional inspection techniques. Note that since the preferred embodiment of the present invention involves reduction steppers, the actual reticle dimensions will be larger than the actual wafer linewidths by a factor equal to the reduction factor. For example, for a 4X reduction stepper, for desired linewidths of 230, 240, 250, 260 and 270 nm as discussed supra, the actual reticle pattern dimensions will be about 920, 960, 1000, 1040 and 1080 nm, respectively. Consequently, the features on the manufactured reticle 200 can be measured with good precision (i.e., approximately ±5 nm, which is about 3$\sigma$ in statistical process control parlance). Preferably, the measurement precision should be better than the variation in the design linewidth (i.e., the value $\Delta$). In the above example, $\Delta$=10 nm and the precision is ±5 nm, therefore the measurement precision is adequate for the present invention.

The actual measured dimensions are then recorded at step 106. Preferably, the reticle measurement tool will make the measurement and save the data in an associated memory. According to the present invention, the measurement data may consist of a single measurement or may alternatively comprise a number of measurements taken along the longitudinal length of each feature.

After the actual reticle dimensions are measured and recorded at steps 104 and 106, respectively, the reticle patterns are transferred to the wafer according to traditional techniques. For example, a wafer (preferably a semiconductor wafer such as silicon) first is cleaned and optionally pre-baked (a dehydration step) to remove any moisture which may have been absorbed by the substrate surface. The wafer is then covered with a photoresist, preferably in a two step process involving a priming step with a pre-resist coating (e.g., hexamethyldisilazane) to improve adhesion and then covered with a photoresist such as a Shipley UV5 series positive photoresist via, for example, spin coating on the wafer surface. Lastly, the photoresist is preferably subjected to a soft-bake which drives off solvent from the spun-on resist material, improves the adhesion of the photoresist and anneals any stresses caused by the shear forces encountered during the spin-on deposition process. The reticle pattern 200 consisting of the plurality of groups 202 of grid-like pattern structures 204 are then transferred to the photoresist by radiation exposure via, for example, a mercury-vapor light source, via the reduction stepper's optical system. After exposure, the photoresist layer is developed using, for example, an alkaline solution diluted with water in either an immersion development, a spray development or a puddle technique process, as may be desired. Therefore in the above exemplary reticle pattern transfer process, the reticle patterns are transferred to the wafer to form wafer patterns at step 108.

The wafer patterns are now inspected and measured at step 110, preferably using conventional measurement tools such as a scanning electron microscope, an electrical probe method or an atomic force microscope. The actual measured pattern linewidths are then recorded, preferably in the same manner as the reticle pattern data, at step 112. If, for example, the electrical probe method is utilized, additional structures such as contact pads may also be included on the wafer.

Figure 5:
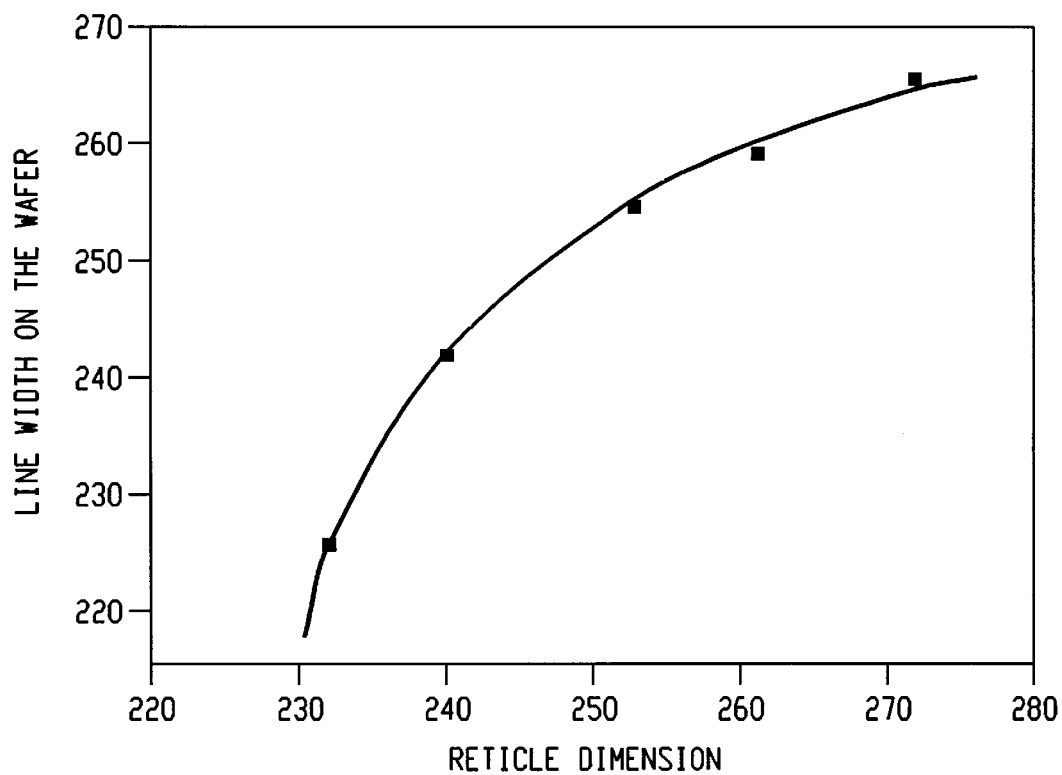
FIG. 5 is a graph illustrating the actual measured reticle linewidth dimensions and the actual measured wafer dimensions and a curve that fits the data.

Once the data for both the actual reticle linewidth data and the actual measured wafer pattern linewidth data has been collected, the data is used to generate a graphical plot and then a curve may be found to fit the data, as illustrated in FIG. 5. Further, since such data is preferably generated at each point in the lens image field, a curve, such as the one illustrated in FIG. 5, may be generated for each point in the lens image field. The curve fitting therefore allows one to interpolate the lens imaging uniformity (lens imaging behavior) at the nominal linewidth dimension even though none of the features actually generated on the reticle may have equaled the nominal linewidth dimension (due to the reticle manufacturing error).

As discussed supra, FIG. 5 provides a graphical representation of the contribution of the manufactured reticle linewidth variations to the total linewidth variations measured at the wafer. Consequently, the remaining linewidth variation is attributable to lens imaging non-uniformities, which include the non-linear transfer of linewidths from the reticle to the wafer. Furthermore, this data may be collected at each point within the lens image field, thereby allowing one to easily measure the lens imaging uniformity across the entire image field.

Figure 6:
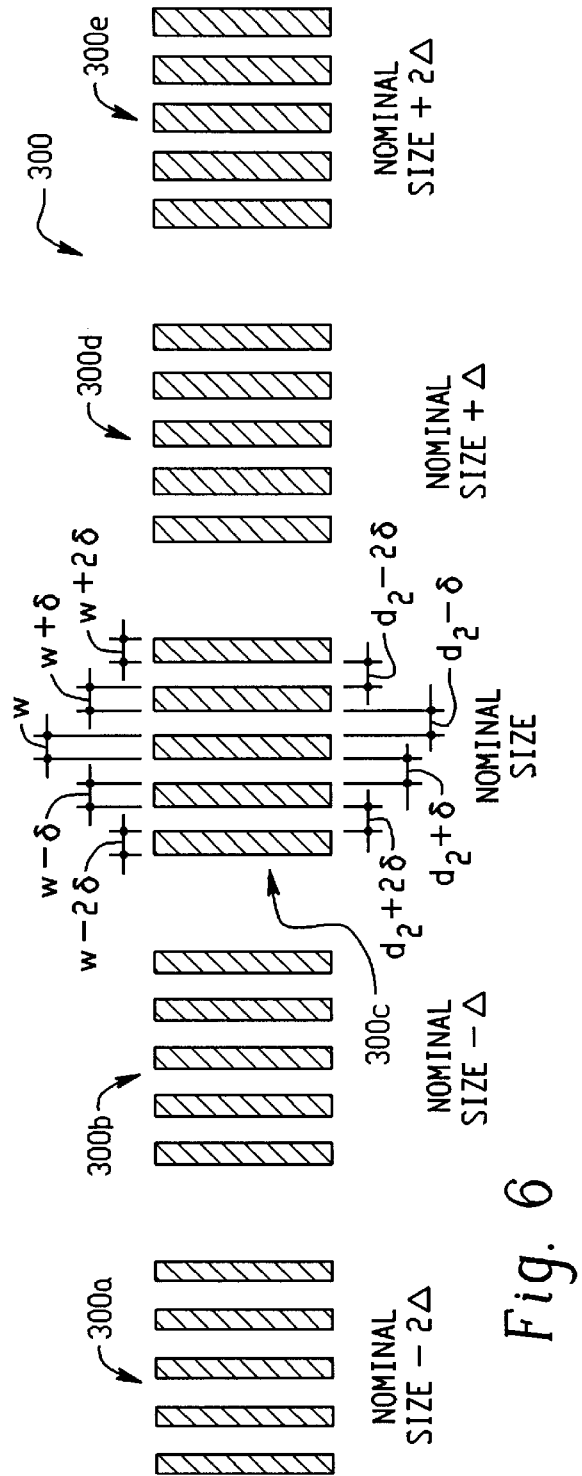
FIG. 6 is an exploded plan view of a test reticle according to another aspect of the present invention having non-isolated features with a constant pitch.

In the preferred embodiment of the present invention, the spacing of each feature in the grid-like pattern was sufficient to allow each feature to be considered an isolated feature. In an alternative embodiment of the present invention, as illustrated in FIG. 6, non-isolated features are utilized on a test reticle to measure the lens imaging uniformity across the lens image field. In the alternative embodiment of FIG. 6, the non-isolated features are generated in a grid-like pattern, wherein each of the structures have a constant pitch.

In FIG. 6, a plurality of grid-like structures 300 are generated, which together correspond to a single grid-like structure such as the structure 202a of FIGS. 4a and 4b. Each of the plurality of structures 300a–300e consist of sub-grids, wherein each of the structures in the subgrids have substantially the same linewidth. In addition, each of the structures 300a–330e have linewidths that differ from one another (e.g., nominal size ±nΔ), however, each of the structures 300a–300e exhibit a constant pitch. As is well known by those skilled in the art, the pitch of a feature consists of the width of the feature and the corresponding space between it and a neighboring feature. Therefore for the pitch to be constant among each of the structures 300a–300e which contain varying linewidths, the spacing between each of the features in the structures 300a–300e should also correspondingly vary so as to maintain the pitch constant. Therefore, for structure 300c, which represents the nominal feature size w with a spacing $d_2$, the structures 300d and 300e, which have linewidths of w+δ and w+2δ, also have corresponding spacings $d_2$-δ and $d_2$-2δ so as to maintain a constant pitch. It is preferred that the pitch be kept constant so that other variables not associated with the non-isolated features will be substantially suppressed so that the influence of the non-isolated features may be simplified when evaluating the lens imaging uniformity.

Figure 7:
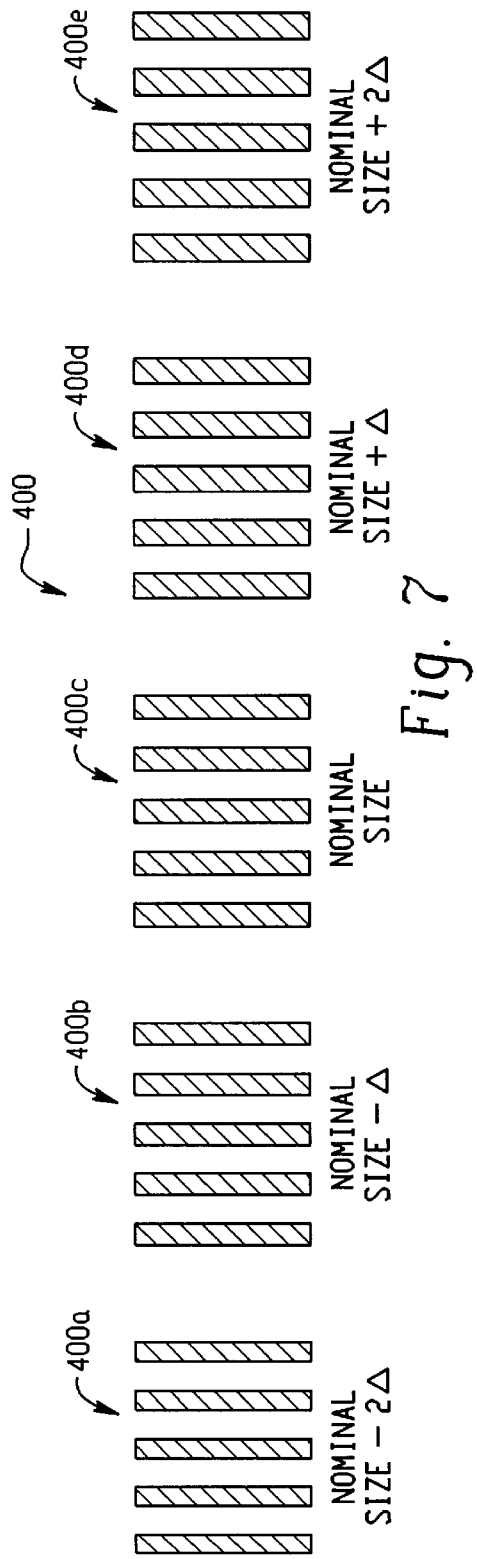
FIG. 7 is an exploded plan view of a test reticle according to yet another aspect of the present invention having non-isolated features with constant spacing.

In another embodiment of the present invention, non-isolated features may be used on the reticle that do not employ a constant pitch as illustrated in FIG. 6, but rather utilize a constant spacing between each of the features, as illustrated in FIG. 7. In FIG. 7, a plurality of grid-like structures 400 are generated, which together correspond to a single grid-like structure such as the structure 202a of FIGS. 4a and 4b. Each of the plurality of structures 400a–400e consist of sub-grids, wherein each of the structures in the subgrids have substantially the same linewidth. In addition, each of the structures 400a–400e have linewidths that differ from one another (e.g., nominal size ±nΔ), however, each of the structures 400a–400e exhibit a constant spacing. Therefore in this case, each subgrid will have a linewidth that varies (e.g., w±nδ) while the spacing d between the features of each subgrid is maintained constant. It is preferred that the spacing be kept constant so that other variables not associated with the non-isolated features will be substantially suppressed so that the influence of the non-isolated features may be simplified when evaluating the lens imaging uniformity.

Although the present invention has been shown and described with respect to certain preferred embodiments, it is obvious that equivalents and modifications will occur to others skilled in the art upon the reading and understanding of the specification. For example, the method of the present invention may be used in "reverse tone" in which the lines which correspond to chrome on the photomask are instead clear areas on the mask. The present invention includes all such equivalents and modifications, and is limited only by the scope of the following claims.

What is claimed is:

1. A method of separating linewidth variations due to reticle generation defects from other linewidth variations at a substrate surface during a pattern transfer process, comprising the steps of:

generating a test reticle having a first plurality of structures forming a first pattern;

measuring a dimension of two or more of the first plurality of structures on the test reticle, thereby creating a first data set representing linewidth variations due to the test reticle generation;

transferring a second pattern to the surface of the substrate using the test reticle, wherein the second pattern includes a second plurality of structures which substantially correspond to the first plurality of structures;

measuring a dimension of two or more of the second plurality of structures, thereby creating a second data set representing the linewidth variations at the surface of the substrate; and evaluating the first and second data sets, thereby identifying an amount of contribution to the substrate linewidth variations due to the test reticle generation.

2. The method of claim 1, wherein at least one of the first plurality structures has a design linewidth different than the others of the first plurality of structures, and wherein when the first plurality of structures are measured, linewidth measurements are collected for more than one design linewidth.

3. The method of claim 2, wherein each of the first plurality of structures vary in a designed linewidth from the others of the first plurality of structures.

4. The method of claim 3, wherein a variation in the designed linewidth of one of the structures to another of the structures is about 2%–5% of a nominal design linewidth.

5. The method of claim 1, wherein the first plurality of structures have a spacing therebetween, wherein the spacing is sufficient to consider the structures isolated structures.

6. The method of claim 5, wherein the spacing is at least about three times a nominal linewidth of the first plurality of structures.

7. The method of claim 1, further comprising forming a plurality of groups covering at least a portion of the test reticle, wherein each of the groups comprise the first plurality of test structures, thereby generating first and second data sets corresponding to each of the groups to identify the amount of contribution to the substrate linewidth variations due to the test reticle generation at substantially each point in a portion of a lens image field.

8. The method claim 1, wherein each of the first plurality of structures include a plurality of substructures, and wherein the plurality of substructures corresponding to one of the first plurality of structures are the same design linewidth.

9. The method of claim 8, wherein the plurality of substructures have a spacing therebetween, wherein the spacing is sufficient to consider the substructures non-isolated structures.

10. The method of claim 8, wherein the plurality of substructures have a common pitch.

11. The method of claim 8, wherein the plurality of substructures have a spacing therebetween that is substantially constant.

12. The method of claim 1, wherein the step of evaluating the first and second data sets comprises the steps of:
plotting the first and second data sets; and
generating a curve that substantially fits the plotted data.

13. The method of claim 12, wherein the step of evaluating the first and second data sets comprises determining the amount of linewidth variation due to reticle generation defects at a nominal linewidth using the generated curve.

14. A method of measuring lens imaging uniformity across a substantial portion of a pattern transfer apparatus lens image field, comprising the steps of:
generating a test reticle having a plurality of groups, wherein the groups include a plurality of reticle structures;
measuring a dimension of two or more of the plurality of reticle structures of each group on the test reticle, thereby creating a first data set representing linewidth variations due to the test reticle generation at a plurality of points on the test reticle;
transferring a pattern to a substrate using the test reticle, wherein the pattern includes a plurality of substrate pattern groups, wherein the wafer groups include a plurality of substrate structures corresponding to the plurality of reticle structures;
measuring a dimension of two or more of the plurality of substrate structures, thereby creating a second data set representing substrate linewidth variations due to the test reticle generation and non-uniformities in an image optics system of the pattern transfer apparatus; and
evaluating the first and second data sets, thereby identifying an amount of contribution to the substrate linewidth variations due to the test reticle generation, and thereby identifying the image optics system non-uniformity at a plurality of points in the lens image field.

15. The method of claim 14, wherein at least one of the plurality of reticle structures has a different design linewidth different than the others of the plurality of reticle structures, and wherein when the plurality of reticle structures are measured, linewidth measurements are collected for more than one design linewidth.

16. The method of claim 14, wherein each of the plurality of reticle structures vary in a designed linewidth from the others of the plurality of reticle structures.

17. The method of claim 16, wherein a variation in the designed linewidth of one of the reticle structures to another of the reticle structures is about 2%–5% of a nominal design linewidth.

18. The method of claim 14, wherein the plurality of reticle structures have a spacing therebetween, wherein the spacing is sufficient to consider the reticle structures isolated structures.

19. The method of claim 18, wherein the spacing is at least about three times a nominal linewidth of the plurality of reticle structures.

20. The method of claim 14, wherein each of the plurality of reticle structures include a plurality of substructures, and wherein the plurality of substructures corresponding to one of the plurality of reticle structures are the same design linewidth.

21. The method claim 20, wherein the plurality of substructures have a spacing therebetween, wherein the spacing is sufficient to consider the substructures non-isolated structures.

22. The method of claim 20, wherein the plurality of substructures have a common pitch.

23. The test reticle of claim 20, wherein the plurality of substructures have a spacing therebetween that is substantially constant.

24. The method of claim 14, wherein the step of evaluating the first and second data sets comprises the steps of:
plotting the first and second data sets; and
generating a curve that substantially fits the plotted data.

25. The method of claim 24, wherein the step of evaluating the first and second data sets comprises determining the amount of linewidth variation due to reticle generation defects at a nominal linewidth using the generated curve.

26. A test reticle for measuring the lens imaging uniformity across a lens image field of a pattern transfer apparatus, comprising:
a plurality of test structures formed on the test reticle, wherein at least one of the test structures has a different design linewidth different than the others of the plurality of test structures,
wherein when the plurality of test structures are measured, linewidth measurements are collected for more than one design linewidth, thereby generating a first data set,
wherein when patterns corresponding to the plurality of test structures are transferred to a substrate via the pattern transfer apparatus, a plurality of substrate structures are formed on the substrate and when the plurality of substrate structures are measured, linewidth measurements are collected for more than one patterned linewidth, thereby generating a second data set, and
the first data set and the second data set are utilized to interpolate components of linewidth variations at a nominal linewidth.

27. The test reticle of claim 26, wherein each of the plurality of test structures vary in a designed linewidth from the others of the plurality of test structures.

28. The test reticle of claim 27, wherein a variation in the designed linewidth of one of the test structures to another of the test structures is about 2%–5% of a nominal design linewidth.

29. The test reticle of claim 26, wherein the plurality of test structures have a spacing therebetween, wherein the spacing is sufficient to consider the test structures isolated structures.

30. The test reticle of claim 29, wherein the spacing is at least about three times a nominal linewidth of the plurality of structures.

31. The test reticle of claim 26, further comprising a plurality of groups covering at least a portion of the test reticle, wherein each of the groups comprise the plurality of test structures, thereby generating first and second data sets corresponding to each of the groups to interpolate components of linewidth variations at a nominal linewidth at substantially each point in a portion of the lens image field.

32. The test reticle of claim 26, wherein each of the plurality of test structures include a plurality of test substructures, and the plurality of test substructures corresponding to one of the test structures are the same design linewidth.

33. The test reticle of claim 32, wherein the plurality of test substructures have a spacing therebetween, wherein the spacing is sufficient to consider the test substructures non-isolated structures.

34. The test reticle of claim 32, wherein the plurality of test substructures have a common pitch.

35. The test reticle of claim 32, wherein the plurality of test substructures have a spacing therebetween that is substantially constant.

* * * * *

UNITED STATES PATENT AND TRADEMARK OFFICE
CERTIFICATE OF CORRECTION

PATENT NO. : 5,969,807

DATED : October 19, 1999

INVENTOR(S) : Levinson et al.

It is certified that error appears in the above-identified patent and that said Letters Patent is hereby corrected as shown below:

In column 3, Line 51, replace the reference numeral "20" with --120--.

Signed and Sealed this

Twenty-eighth Day of March, 2000

Attest:

Q. TODD DICKINSON

*Attesting Officer*      *Commissioner of Patents and Trademarks*